(12) United States Patent
Mioki et al.

(10) Patent No.: US 10,698,463 B2
(45) Date of Patent: Jun. 30, 2020

(54) CONTROLLER, CONTROL METHOD, AND PROGRAM FOR POWER CUT STATE RESTORATION

(71) Applicant: OMRON Corporation, Kyoto-shi, Kyoto (JP)

(72) Inventors: Takamasa Mioki, Moriyama (JP); Mizuki Mori, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 201 days.

(21) Appl. No.: 15/678,647

(22) Filed: Aug. 16, 2017

(65) Prior Publication Data

US 2018/0095513 A1 Apr. 5, 2018

(30) Foreign Application Priority Data

Sep. 30, 2016 (JP) ................ 2016-193717

(51) Int. Cl.
*G06F 12/14* (2006.01)
*G06F 1/26* (2006.01)
(Continued)

(52) U.S. Cl.
CPC .......... *G06F 1/266* (2013.01); *G05B 19/045* (2013.01); *G05B 19/4067* (2013.01); *G06F 1/263* (2013.01); *G06F 1/30* (2013.01); *G06F 11/1435* (2013.01); *G06F 11/1441* (2013.01); *G06F 12/0638* (2013.01); *H03K 19/1776* (2013.01); *H03K 19/17772* (2013.01);
(Continued)

(58) Field of Classification Search
None
See application file for complete search history.

(56) References Cited

U.S. PATENT DOCUMENTS 7,733,712 B1 * 6/2010 Walston ................ G11C 5/005
365/189.09
2005/0080762 A1 * 4/2005 Nakashima ......... G06F 11/1435
(Continued)

FOREIGN PATENT DOCUMENTS

EP 0471860 A1 2/1992
JP 2010-176386 A 8/2010

OTHER PUBLICATIONS

Extended European search report (EESR) dated Mar. 5, 2018 in a counterpart European Patent application.
(Continued)

*Primary Examiner* — William B Partridge
*Assistant Examiner* — Eric T Loonan
(74) *Attorney, Agent, or Firm* — Metrolex IP Law Group, PLLC (57) ABSTRACT

A control unit included in a PLC generates power-cut retaining information to be retained at a power cut, and stores the generated power-cut retaining information into a main memory. The control unit includes a file system unit for reading and writing target information from and into a nonvolatile memory. When the file system unit receives a power cut notification indicating a cut of power fed while reading or writing target information from or into a nonvolatile memory, the file system unit stops the reading or writing process, and writes the power-cut retaining information stored in the main memory into the nonvolatile memory using power fed from the auxiliary power supply.

3 Claims, 4 Drawing Sheets

(51) Int. Cl.
*G06F 1/30* (2006.01)
*G05B 19/4067* (2006.01)
*G05B 19/045* (2006.01)
*G06F 11/14* (2006.01)
*G06F 12/06* (2006.01)
*H03K 19/1776* (2020.01)
*H03K 19/17772* (2020.01)
*H02J 9/06* (2006.01)

(52) U.S. Cl.
CPC ............. *G05B 2219/15097* (2013.01); *G06F 2212/205* (2013.01); *H02J 9/06* (2013.01)

(56) References Cited

U.S. PATENT DOCUMENTS

2010/0191872 A1 7/2010 Iguchi et al.
2012/0151118 A1* 6/2012 Flynn ................. G06F 11/1008
711/6

OTHER PUBLICATIONS

Stephen A. Ward et al, "Computation Structures", In: "Computation Structures", Dec. 31, 1990, p. 353, The MIT Press—McGraw-Hill Book Company, XP055450648, cited in the EESR issued on Mar. 5, 2018.

Anonymous, "Write-ahead logging", Wikipedia—The Free Encyclopedia, Mar. 14, 2016, XP002778395, Retrieved from the Internet: URL: https://en.wikipedia.org/wiki/Write-ahead logging [retrieved on Feb. 21, 2018], cited in the EESR issued on Mar. 5, 2018.

Anonymous, "Hierarchical storage management-Wikipedia", Retrieved from the internet, URL:https://en.wikipedia.org/w/index.php?title=Hierarchical_storage_management&oldid=708838270 (retrieved on Nov. 14, 2019), Mar. 7, 2016, XP055642763; Relevance is indicated in the Communication pursuant to Article 94(3) EPC issued on Jan. 7, 2020.

The Communication pursuant to Article 94(3) EPC issued on Jan. 7, 2020 in a counterpart European patent application.

* cited by examiner

CONTROLLER, CONTROL METHOD, AND PROGRAM FOR POWER CUT STATE RESTORATION

CROSS REFERENCE TO RELATED APPLICATIONS

This application claims priority from prior Japanese Patent Application No. 2016-193717 filed with the Japan Patent Office on Sep. 30, 2016, the entire contents of which are incorporated herein by reference.

FIELD

The disclosure relates to a controller, a control method, and a program for controlling equipment or machines.

BACKGROUND

Factory automation (FA) devices known to control equipment or machines include programmable logic controllers (PLCs) or programmable controllers.

A PLC writes information, such as setting information, that is referred to by a control program for controlling equipment or machines into nonvolatile memory as appropriate, and reads the information when needed.

Japanese Unexamined Patent Application Publication No. 2010-176386 (Patent Literature 1) describes a technique for retaining a data area and a data value before data is written as well as a data area and a data value after the data is written in a redundant manner. Such redundant-data retaining technique intends to prevent corruption of information when power fed from an external power supply is cut, in the event of, for example, a power outage.

CITATION LIST

Patent Literature

Patent Literature 1: Japanese Unexamined Patent Application Publication No. 2010-176386

SUMMARY

Technical Problem

When a PLC is reactivated after a power cut, the PLC is desired to restore the state before the power cut. However, the above technique for preventing information corruption described in Patent Literature 1 does not describe a process of writing, at the power cut, information to be retained at the power cut for restoring the state before the power cut (hereafter, power-cut retaining information). Thus, the PLC cannot restore the state before the power cut in a stable manner when reactivated.

A dedicated nonvolatile memory may be installed for storing such power-cut retaining information, separately from nonvolatile memory used in normal operation other than the operation at the power cut. Also, a dedicated processor may be installed for storing power-cut retaining information into the dedicated nonvolatile memory, separately from a processor for executing a control program. However, the nonvolatile memory and the processor add to the number of components.

One or more aspects of the present invention are directed to a controller, a control method, and a program that allow, after a power cut, stable restoration of the state before the power cut without increasing the number of components.

Solution to Problem

A controller according to one aspect of the present invention for controlling equipment or a machine includes a volatile storage, a nonvolatile storage, an auxiliary power supply that feeds power at a power cut when power fed from an external power supply is cut, and a control unit that generates power-cut retaining information to be retained at the power cut, and stores the generated power-cut retaining information into the volatile storage. The control unit includes a file system unit that reads and writes target information from and into the nonvolatile storage. When receiving a power cut notification indicating a cut of power fed from the external power supply while reading or writing target information from or into the nonvolatile storage, the file system unit stops reading or writing the target information from or into the nonvolatile storage, and writes the power-cut retaining information stored in the volatile storage into the nonvolatile storage using power fed from the auxiliary power supply.

In some embodiments, the nonvolatile storage includes a first area and a second area. The file system unit stops reading or writing target information from or into the first area when receiving the power cut notification while reading or writing the target information, and continues to read or write the target information from or into the second area when receiving the power cut notification while reading or writing the target information.

In some embodiments, the file system unit divides the target information into a plurality of recording portions, and reads and writes each recording portion of the target information from and into the nonvolatile storage. The file system unit writes the power-cut retaining information into the nonvolatile storage after the file system unit completes reading or writing a processing target recording portion that is being read or written when the file system unit receives the power cut notification.

In some embodiments, when writing the target information into the nonvolatile storage, the file system unit writes information accompanying the target information into the nonvolatile storage. When receiving the power cut notification while the file system unit is writing the target information into the nonvolatile storage, the file system unit updates the information accompanying the target information in accordance with information written into the nonvolatile storage before the file system unit receives the power cut notification.

A control method used in a controller for controlling equipment or a machine according to another aspect of the present invention includes generating power-cut retaining information to be retained at a power cut, and storing the generated power-cut retaining information into a volatile storage, and stopping, when receiving a power cut notification indicating a cut of power fed from an external power supply while reading or writing target information from or into a nonvolatile storage, reading or writing the target information from or into the nonvolatile storage, and writing the power-cut retaining information stored in the volatile storage into the nonvolatile storage using power fed from an auxiliary power supply.

A program according to another aspect of the present invention that is implemented by a controller for controlling equipment or a machine enables a processor included in the controller to implement generating power-cut retaining information to be retained at a power cut, and storing the generated power-cut retaining information into a volatile storage, and stopping, when receiving a power cut notification indicating a cut of power fed from an external power supply while reading or writing the target information from or into a nonvolatile storage, reading or writing target information from or into the nonvolatile storage, and writing the power-cut retaining information stored in the volatile storage into the nonvolatile storage using power fed from an auxiliary power supply.

Advantageous Effects

Embodiments of the present invention allow, after a power cut, stable restoration of the state before the power cut without increasing the number of components.

DETAILED DESCRIPTION

Embodiments of the present invention will now be described in detail with reference to the drawings. The same or the corresponding components in the figures are given the same reference numerals, and will not be described redundantly.

Hardware Configuration of PLC

Figure 1:
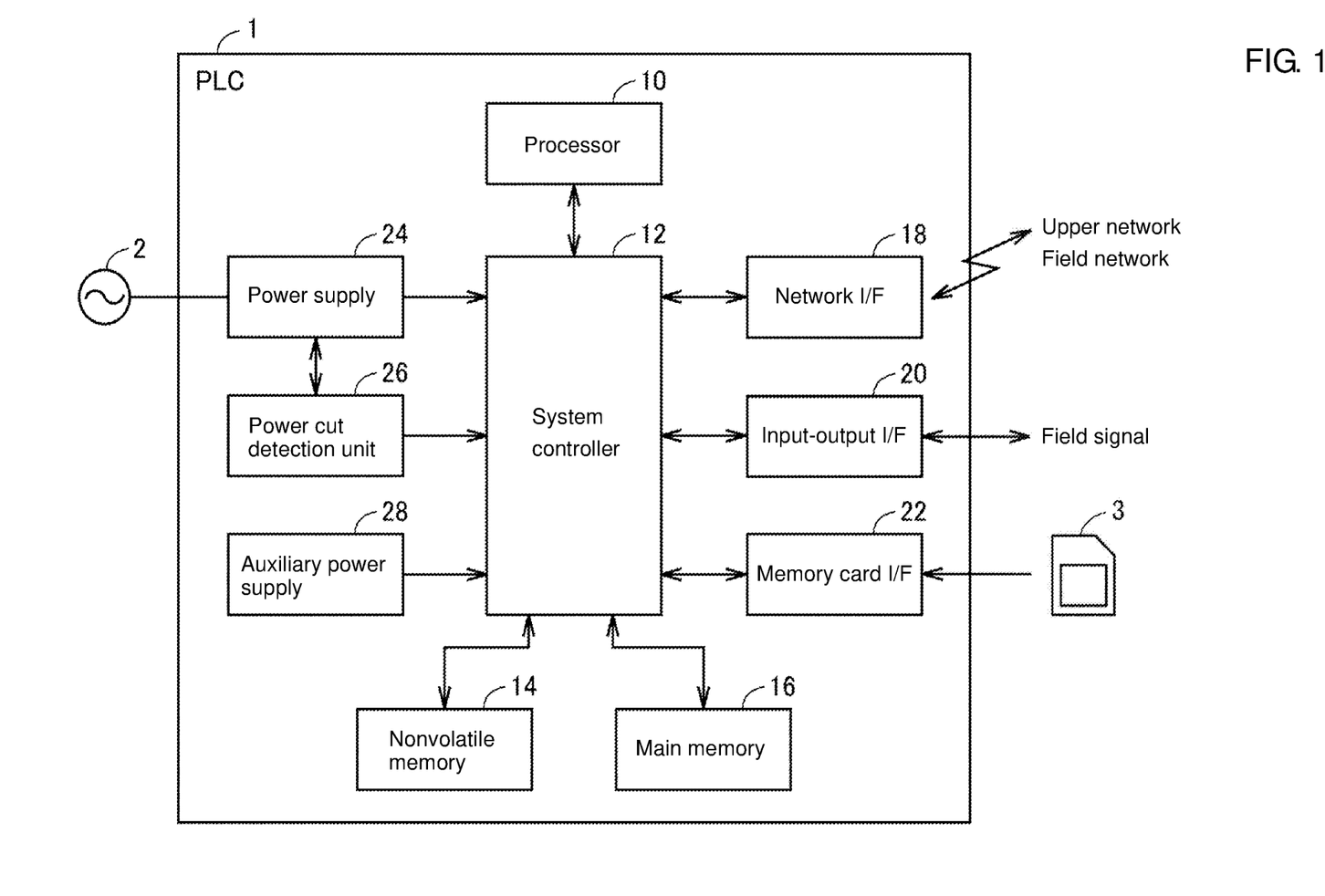
FIG. 1 is a schematic diagram showing the hardware configuration of a PLC according to one embodiment of the present invention.

FIG. 1 is a schematic diagram showing the hardware configuration of a PLC 1 according to one embodiment. The PLC 1 is a controller for controlling the operation of equipment or a machine. The PLC 1 shown in FIG. 1 is basically a computing element with a general-purpose architecture, and has a hardware configuration similar to that of a general-purpose personal computer.

The PLC 1 shown in FIG. 1 includes a processor 10, a system controller 12, a nonvolatile memory 14, a main memory 16, a network interface (I/F in FIG. 1) 18, an input-output I/F 20, a power supply 24, a power cut detection unit 26, and an auxiliary power supply 28.

The processor 10 is an arithmetic logic unit, such as a central processing unit (CPU), a microprocessing unit (MPU), and a graphics processing unit (GPU), that executes various programs. The processor 10 interprets and executes instruction codes that are sequentially fed from the system controller 12 in accordance with the internal clock. The processor 10 may include a plurality of processors or may be a single processor including a plurality of arithmetic cores. In other words, the processor 10 may be a multiprocessor or may be a multicore processor.

The system controller 12 transmits and receives internal data to and from the processor 10 and peripheral devices, and generates an instruction code for the processor 10. The system controller 12 also caches the data resulting from computation executed by the processor 10. The system controller 12 is typically a large-scale integration (LSI) circuit.

The main memory 16 is, for example, a volatile memory such as a random access memory (RAM), and temporarily stores work data used for the processor 10 to execute the programs and data obtained from an external device. The main memory 16 is typically a volatile storage device such as a dynamic random access memory (DRAM) or a static random access memory (SRAM).

The nonvolatile memory 14 is a storage device (nonvolatile storage) that stores the programs executed by the processor 10 and the information generated through the program execution by the processor 10 in a nonvolatile manner.

The network I/F 18 allows data communication with another device. Examples of the network I/F 18 include a port connected to an upper computer or an upper network, a port connected to various field devices (e.g., equipment, machines, and sensors) through a field network or a field bus, and a port for data communication with another controller. The network I/F 18 may be a device in accordance with any standard such as Ethernet (registered trademark), EtherCAT (registered trademark), or another wired standard, or a wireless local area network (WLAN), Bluetooth (registered trademark), or another wireless standard.

The input-output I/F 20 corresponds to an input-output unit, and allows transmission and reception of field signals (e.g., digital input-output signals, analog input-output signals, and pulse signals) with the field devices.

A memory card I/F 22 allows information to be read from and written into a memory card 3, such as an SD card (registered trademark).

The power supply 24 transforms power fed from an external power supply 2 to a predetermined voltage, and applies the voltage to each component. The power supply 24 typically includes a switching regulator. The power supply 24 includes a power button. In response to every operation of the power button performed by the user, the power supply 24 switches between the on-state in which the predetermined voltage is applied to each component and the off-state in which the predetermined voltage is not applied to each component.

The power cut detection unit 26 monitors the operational state of the power supply 24, and outputs a power cut signal to the system controller 12 upon detecting the start time of a power cut. The start time of a power cut refers to the time at which the state in which the predetermined voltage is applied to each component from the external power supply 2 through the power supply 24 has shifted to the state in which the voltage is not applied to each component. The start time of a power cut includes the time at which the power button of the power supply 24 is operated to switch from the on-state to the off-state, and the time at which the power fed from the external power supply 2 to the power supply 24 is cut due to, for example, a power outage.

The auxiliary power supply 28 applies a predetermined voltage to each component for a predetermined time (e.g., tens to hundreds of milliseconds) from the start time of a power cut. The auxiliary power supply 28 is, for example, an electricity storage device such as a capacitor. The auxiliary power supply 28 is charged using the power fed from the power supply 24 before the start time of a power cut, and starts being discharged at the start time of the power cut.

Software Configuration of PLC

Figure 2:
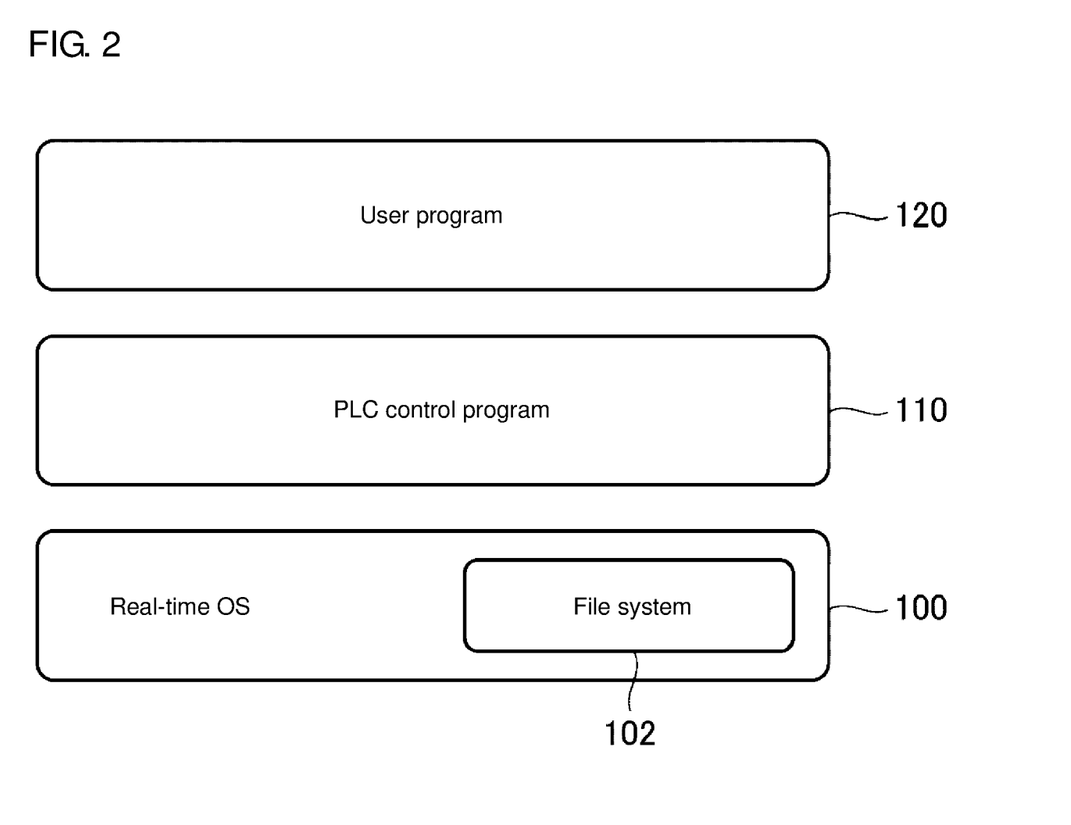
FIG. 2 is a schematic diagram showing the configuration of software executed in the PLC shown in FIG. 1.

FIG. 2 is a schematic diagram showing the configuration of software executed in the PLC 1. As shown in FIG. 2, the software executed by the PLC 1 includes three layers, which are a real-time operating system (OS) 100, a PLC control program 110, and a user program 120.

The real-time OS 100 is designed in accordance with the computer architecture, and provides a basic execution environment for the processor 10 to execute the PLC control program 110 and the user program 120.

The real-time OS 100 includes a file system 102 for implementing the function of reading and writing information from and into the nonvolatile memory 14.

The PLC control program 110 operates in a layer above the real-time OS 100, and serves as a platform for implementing functions intended for the user program 120. The PLC control program 110 includes multiple subsystems for implementing the function of controlling the interface with peripheral devices and other functions.

Examples of the subsystems in the PLC control program 110 include a scheduler program, an output processing program, an input processing program, a sequence instruction computing program, and a motion computing program.

The scheduler program controls the processing start and the processing restart after the interrupted processing in each execution cycle.

The output processing program reprocesses the output data generated through the execution of the user program 120 into a form appropriate for transfer to the network I/F 18 and/or the input-output I/F 20.

The input processing program reprocesses the input data received through the network I/F 18 and/or the input-output I/F 20 into a form appropriate for use by the user program 120.

The sequence instruction computing program is called when a certain sequence instruction used in the user program 120 is executed. The program is then executed to enable the processing corresponding to the instruction.

The motion computing program is executed in accordance with an instruction provided from the user program 120. The motion computing program calculates a command value to be output to a motor driver for driving equipment or a machine.

The user program 120 operates in a layer above the PLC control program 110, and serves to control equipment or a machine.

The real-time OS 100 and the PLC control program 110 are stored in the nonvolatile memory 14 in the manufacturing stage of the PLC 1. However, the user may connect the memory card 3 (refer to FIG. 1) retaining the real-time OS 100 and the PLC control program 110 to the PLC 1, and install the real-time OS 100 and the PLC control program 110 from the memory card 3 into the nonvolatile memory 14.

The user program 120 is designed by the user as appropriate for the equipment or machine to be controlled, and is installed in the PLC 1.

Functional Components of PLC

Figure 3:
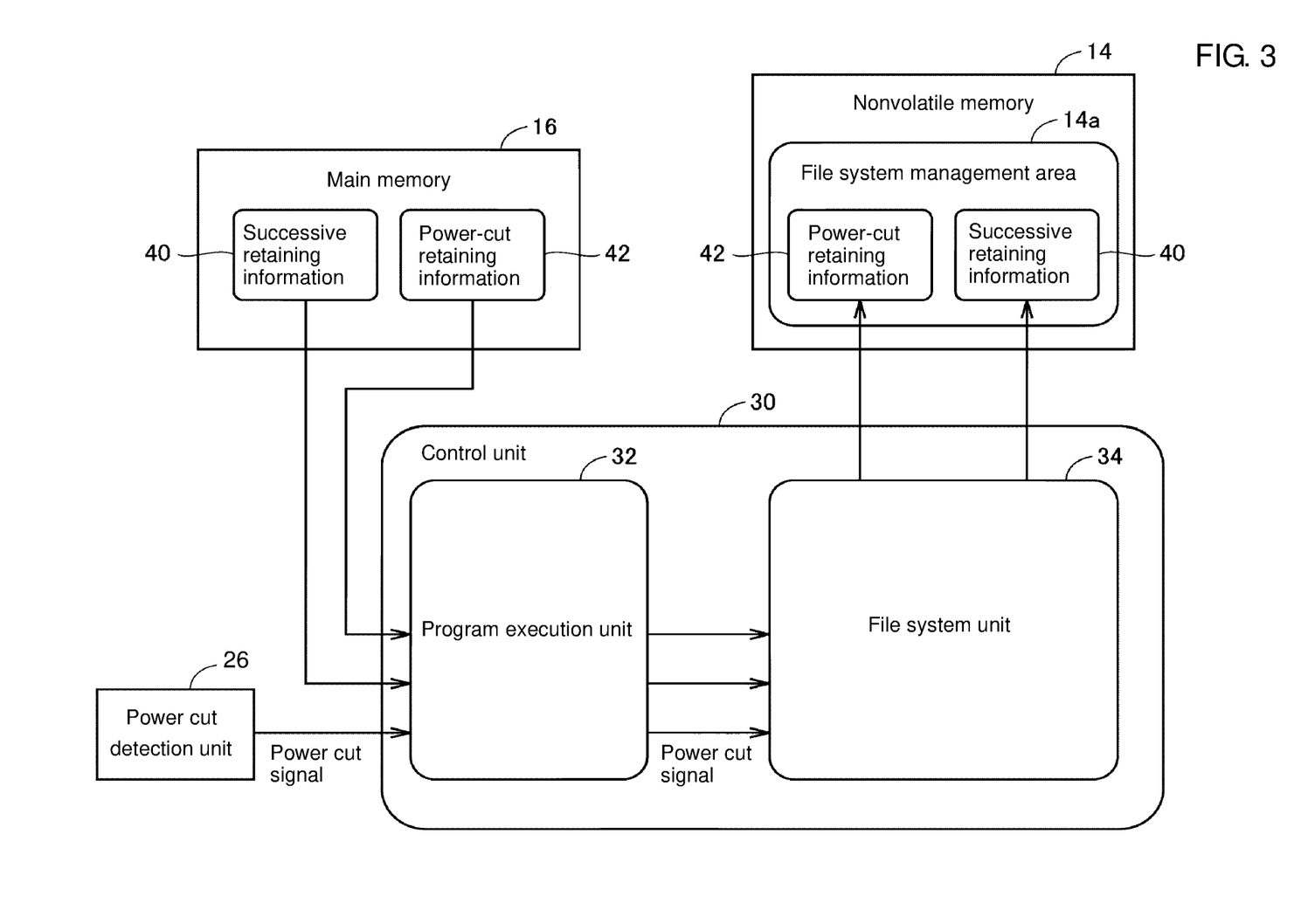
FIG. 3 is a schematic diagram showing the main functional components of the PLC shown in FIG. 1.

FIG. 3 is a schematic diagram showing the main functional components of the PLC 1. As shown in FIG. 3, the PLC 1 includes a control unit 30 including a program execution unit 32 and a file system unit 34.

The control unit 30 controls the equipment or machine to be controlled. The control unit 30 is a functional block implemented by the processor 10 shown in FIG. 1 executing the software shown in FIG. 2. The program execution unit 32 is a functional block implemented by the processor 10 mainly executing the PLC control program 110 and the user program 120 shown in FIG. 2. The file system unit 34 is a functional block implemented by the processor 10 executing the file system 102 shown in FIG. 2.

The control unit 30 stores, as appropriate, various types of information used for the processing in the program execution unit 32 into the main memory 16, which serves as a working memory.

The information stored into the main memory 16 includes successive retaining information 40, which is to be retained successively during the operation of the program execution unit 32, and power-cut retaining information 42, which is to be retained at a power cut and is used to restore the state before the power cut when the PLC 1 is reactivated after the power cut.

The successive retaining information 40 includes, for example, the user program 120, the PLC control program 110, and binary information, control setting information, and internal history information about the subsystems of the PLC control program 110.

The control setting information is defined and referred to by the PLC control program 110, and includes information that does not need to be retained at a power cut and may simply be retained at a predetermined time. The control setting information is, for example, initialization files for the subsystems of the PLC control program 110 and network configuration information.

The internal history information is defined and referred to by the PLC control program 110 and indicates events that have occurred in the PLC 1 (log information). The internal history information also includes troubleshooting information.

The power-cut retaining information 42 includes, for example, a retaining variable and a control flag. The retaining variable is a parameter that is defined and referred to by the user program 120 and is associated with the state of the equipment or machine to be controlled. For example, this parameter in the PLC 1 used for controlling a robot arm includes positional information for the robot arm. The retaining variable stored in the main memory 16 is updated by the control unit 30 in accordance with changes in the state of the control target. When the PLC 1 is reactivated after a power cut, the retaining variable is to be used by the PLC 1 to determine the state of the control target immediately before the power cut.

The control flag is a flag parameter that is defined and referred to by the PLC control program 110 and changes together with the operational state of the user program 120. The control flag stored in the main memory 16 is updated by the control unit 30 in accordance with the operational state of the user program 120. When the PLC 1 is reactivated after a power cut, the control flag is used by the PLC control program 110 to restore the operational state of the user program 120 to the state immediately before the power cut.

In accordance with the user program 120 or the PLC control program 110, the program execution unit 32 determines at least a part of the information stored in the main memory 16 as target information, and instructs the file system unit 34 to read and write the target information from and into the nonvolatile memory 14.

More specifically, the program execution unit 32 identifies information included in the successive retaining information 40 stored in the main memory 16 as information to be written into the nonvolatile memory 14. The program execution unit 32 outputs an instruction to the file system unit 34 to write the identified successive retaining information 40 into the nonvolatile memory 14.

When receiving a power cut signal from the power cut detection unit 26, the program execution unit 32 reads the power-cut retaining information 42 from the main memory 16, and outputs an instruction to write the read power-cut retaining information 42 and a power cut notification to the file system unit 34.

The file system unit 34 controls information for a file system management area 14a in the nonvolatile memory 14. More specifically, the file system unit 34 reads and writes the specified target information from and into the nonvolatile memory 14 as instructed by the program execution unit 32. The file system unit 34 sequentially processes specified items of target information.

The file system unit 34 writes the target information into the nonvolatile memory 14 by outputting a write signal corresponding to the target information to the nonvolatile memory 14. More specifically, the file system unit 34 divides the target information into a plurality of recording portions, and reads or writes each recording portion of the target information from or into the nonvolatile memory 14. The recording portions each have a predetermined size.

The file system unit 34 writes the information accompanying the target information into the nonvolatile memory 14 as a header before writing the target information to the nonvolatile memory 14. The accompanying information includes the address in the memory space into which the target information is to be written.

When receiving an instruction from the program execution unit 32 to write the successive retaining information 40 or the power-cut retaining information 42, the file system unit 34 sequentially writes the successive retaining information 40 or the power-cut retaining information 42 into the file system management area 14a in the nonvolatile memory 14 in accordance with the instruction.

However, when the file system unit 34 receives an instruction to write the power-cut retaining information 42 and a power cut notification while processing (reading or writing) the successive retaining information 40 as preinstructed, the file system unit 34 stops processing the successive retaining information 40 and starts writing the power-cut retaining information 42.

When a power cut notification is received, the power fed from the external power supply 2 through the power supply 24 is cut, and the auxiliary power supply 28 feeds power to the PLC 1. The time period during which the auxiliary power supply 28 feeds power (hereafter, an auxiliary-power-supply operating period) is limited. Thus, if the file system unit 34 starts writing the power-cut retaining information 42 after completing the processing of the successive retaining information 40, the auxiliary-power-supply operating period may pass before the power-cut retaining information 42 is written completely.

However, when receiving a power cut notification, the file system unit 34 places a higher priority to writing the power-cut retaining information 42 than to writing the successive retaining information 40 that is being processed. Additionally, the auxiliary power supply 28 has an electric capacity that extends the auxiliary-power-supply operating period to be longer than the time normally taken to write the power-cut retaining information 42. This enables the power-cut retaining information 42 to be written into the nonvolatile memory 14 in a more reliable manner.

The file system unit 34 may complete the processing of the recording portion of the target information that is being processed when receiving a power cut notification, and then discard data corresponding to the remaining recording portions to stop processing the successive retaining information 40. As described above, the file system unit 34 is designed to process each recording portion of information. Thus, the file system unit 34 may stop processing the successive retaining information 40 at the end of the recording portion that is being processed when receiving a power cut notification. In other words, the file system unit 34 may be easily designed without adding the function of stopping processing the information in the middle of a recording portion.

When stopping writing the successive retaining information 40 into the nonvolatile memory 14 in response to a power cut notification, the file system unit 34 updates the accompanying information in accordance with the information already written into the nonvolatile memory 14.

Procedure at Power Cut

Figure 4:
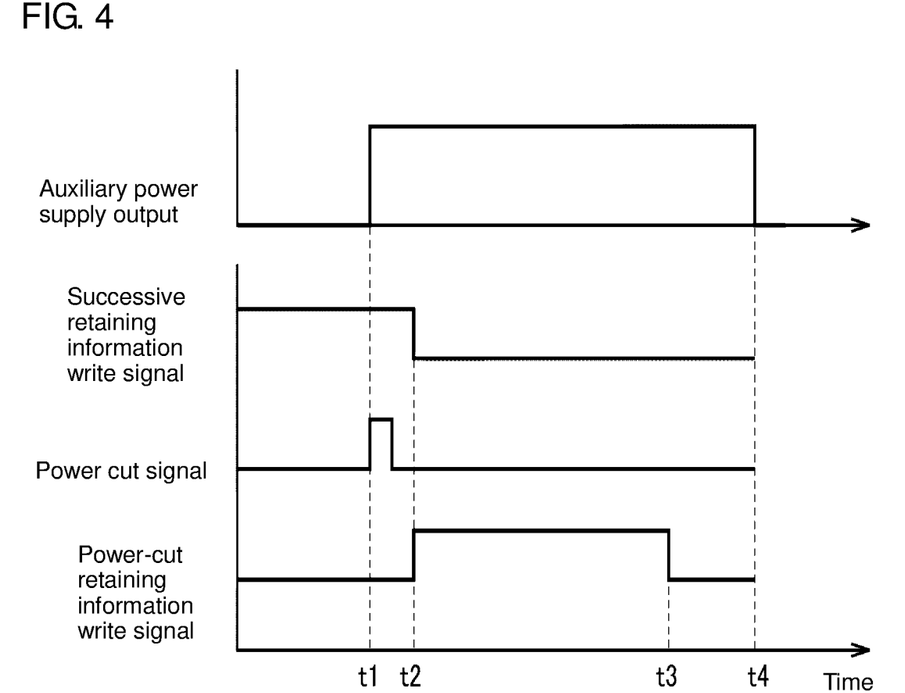
FIG. 4 is a sequence diagram showing the procedure performed in the PLC shown in the FIG. 1 at a power cut.

FIG. 4 is a sequence diagram showing the procedure performed in the PLC 1 at a power cut. In an example shown in FIG. 4, a power cut occurs at time t1 while the successive retaining information 40 is being written into the nonvolatile memory 14 (in other words, the file system unit 34 is outputting the write signal corresponding to the successive retaining information 40 to the nonvolatile memory 14).

At time t1, the power cut detection unit 26 detects the power cut and outputs a power cut signal to the control unit 30. At this timing, the auxiliary power supply 28 starts feeding power. When receiving the power cut signal, the program execution unit 32 reads the power-cut retaining information 42 from the main memory 16, and outputs the read power-cut retaining information 42 and a power cut notification to the file system unit 34.

When receiving the power cut notification, the file system unit 34 stops writing the successive retaining information 40 into the nonvolatile memory 14. More specifically, the file system unit 34 continues to process only the recording portion that is being written when receiving the power cut notification, and discards the data corresponding to the subsequent recording portions. When receiving the power cut notification, the file system unit 34 also updates the information accompanying the successive retaining information 40 that is being processed in accordance with the already processed data.

At time t2, when the recording portion that is being written upon receiving the power cut notification is completely processed, and the accompanying information is also completely updated, the file system unit 34 outputs the write signal corresponding to the power-cut retaining information 42 to the nonvolatile memory 14, and starts writing the power-cut retaining information 42. At time t3, the file system unit 34 completes the writing process of the power-cut retaining information 42. As described above, the auxiliary power supply 28 has an electric capacity that extends the auxiliary-power-supply operating period to be longer than the time normally taken to write the power-cut retaining information 42. This allows the file system unit 34 to complete the writing of the power-cut retaining information 42 at time t3, which is before time t4 when the auxiliary-power-supply operating period passes. This procedure allows the power-cut retaining information 42 to be stored into the nonvolatile memory 14 in a more reliable manner. As a result, when reactivated after a power cut, the PLC 1 can restore the state before the power cut.

Modifications

In the above embodiments, the file system unit 34 stops the processing when receiving a power cut notification while processing (reading or writing) the successive retaining information 40. However, the user program may intend a higher priority to be placed to some items of successive retaining information 40 than to the power-cut retaining information 42.

The file system unit 34 may divide the file system management area 14a in the nonvolatile memory 14 into two areas, a first area and a second area. When receiving a power cut notification while writing the successive retaining information 40 into the first area, the file system unit 34 stops processing the successive retaining information 40 as in the above embodiments.

When receiving a power cut notification while writing the successive retaining information 40 into the second area, the file system unit 34 continues to write the successive retaining information 40 without stopping the processing. The file system unit 34 writes the entire successive retaining information 40 completely before starting to write the power-cut retaining information 42. In this case, although the power-cut retaining information 42 may not be written into the nonvolatile memory, the successive retaining information 40 having a higher priority than the power-cut retaining information 42 is written into the nonvolatile memory 14.

When the program execution unit 32 outputs an instruction to the file system unit 34 to write the successive retaining information 40, the program execution unit 32 may designate the first area or the second area into which information is written, in accordance with the priority of the successive retaining information 40.

The power-cut retaining information 42 may include the information to be retained at least at a power cut, and may also include information not needed at a power cut (e.g., internal history information, or log information).

Advantages

In this manner, the control unit 30 in the PLC 1 according to the present embodiment generates the power-cut retaining information 42 to be retained at a power cut, and stores the generated power-cut retaining information 42 into the main memory 16. The control unit 30 includes the file system unit 34 for reading and writing target information from and into the nonvolatile memory 14. When the file system unit 34 receives a power cut notification while reading or writing the target information from or into the nonvolatile memory 14, the file system unit 34 stops the processing and uses the power fed from the auxiliary power supply 28 to write the power-cut retaining information 42 stored in the main memory 16 into the nonvolatile memory 14.

This enables the power-cut retaining information 42 to be stored into the nonvolatile memory 14 in a more reliable manner. As a result, when reactivated after a power cut, the PLC 1 restores the state before the power cut in a stable manner.

The power-cut retaining information 42 is written into the nonvolatile memory 14 used in normal operation that is other than the operation at a power cut (the nonvolatile memory 14 into which the successive retaining information 40 is written). The file system unit 34, which reads and writes the successive retaining information 40 from and into the nonvolatile memory 14, also writes the power-cut retaining information 42. Thus, this system does not need a nonvolatile memory and a processor for the successive retaining information 40 separately from a nonvolatile memory and a processor for the power-cut retaining information 42. This structure prevents the number of components from increasing.

The embodiments disclosed herein should be considered to be in all respects illustrative and not restrictive. The scope of the invention is defined by the appended claims, and all changes that come within the meaning and range of equivalency of the claims are intended to fall within the claims.

REFERENCE SIGNS LIST

1 PLC
2 external power supply
3 memory card
10 processor
12 system controller
14 nonvolatile memory
16 main memory
18 network I/F
20 input-output I/F
22 memory card I/F
24 power supply
26 power cut detection unit
28 auxiliary power supply
30 control unit
32 program execution unit
34 file system unit

The invention claimed is:

1. A controller comprising:
a volatile storage;
a nonvolatile storage comprising a first area and a second area;
an auxiliary power supply configured to feed power at a power cut in response to power fed from an external power supply being cut; and
a processor configured with a program to perform operations comprising operation as a control unit configured to
generate power-cut retaining information to be retained at the power cut, and
store the generated power-cut retaining information into the volatile storage, wherein
the processor is configured with the program to perform operations such that operation as the control unit comprises operation as the control unit comprising operation as a file system unit configured to
read and write target information from and into one of the first area and the second area of the nonvolatile storage,
in response to receiving a power cut notification indicating a cut of power fed from the external power supply while reading or writing the target information from or into the first area of the nonvolatile storage, stop reading or writing the target information from or into the nonvolatile storage, and write the power-cut retaining information stored in the volatile storage into the nonvolatile storage using power fed from the auxiliary power supply, and
in response to receiving the power cut notification indicating the cut of power fed from the external power supply while writing the target information into the second area of the nonvolatile storage, complete writing the target information into the second area of the nonvolatile storage before writing the power-cut retaining information stored in the volatile storage into the nonvolatile storage.

2. A control method used in a controller comprising a volatile storage, a nonvolatile storage comprising a first area and a second area, and an auxiliary power supply configured to feed power at a power cut in response to power fed from an external power supply being cut,
the control method comprising:
generating power-cut retaining information to be retained at the power cut, and storing the generated power-cut retaining information into the volatile storage;
stopping, in response to receiving a power cut notification indicating a cut of power fed from the external power supply while reading or writing target information from or into the first area of the nonvolatile storage, reading or writing the target information from or into the nonvolatile storage, and writing the power-cut retaining information stored in the volatile storage into the nonvolatile storage using power fed from the auxiliary power supply; and complete writing, in response to receiving the power cut notification indicating the cut of power fed from the external power supply while reading or writing the target information from or into the second area of the nonvolatile storage, the target information into the second area of the nonvolatile storage before writing the power-cut retaining information stored in the volatile storage into the nonvolatile storage.

3. A non-transitory computer-readable recording medium storing a program that is implemented by a controller comprising a volatile storage, a nonvolatile storage comprising a first area and a second area, and an auxiliary power supply configured to feed power at a power cut in response to power fed from an external power supply being cut, the program, when read and executed, causing a processor comprised in the controller to perform operations comprising:

generating power-cut retaining information to be retained at the power cut, and storing the generated power-cut retaining information into the volatile storage;

stopping, in response to receiving a power cut notification indicating a cut of power fed from the external power supply while reading or writing target information from or into the first area of the nonvolatile storage, reading or writing the target information from or into the nonvolatile storage, and writing the power-cut retaining information stored in the volatile storage into the nonvolatile storage using power fed from the auxiliary power supply; and complete writing, in response to receiving the power cut notification indicating the cut of power fed from the external power supply while reading or writing the target information from or into the second area of the nonvolatile storage, the target information into the second area of the nonvolatile storage before writing the power-cut retaining information stored in the volatile storage into the nonvolatile storage.

\* \* \* \* \*